US006747230B2

(12) United States Patent  (10) Patent No.: US 6,747,230 B2
Caspary et al.  (45) Date of Patent: Jun. 8, 2004

(54) METHOD AND DEVICE FOR SORTING WAFERS

(75) Inventors: Dirk Caspary, Dresden (DE); Dorit Kaulfuss, Kamenz (DE)

(73) Assignee: Infineon Technologies AG, Munich (DE)

( * ) Notice: Subject to any disclaimer, the term of this patent is extended or adjusted under 35 U.S.C. 154(b) by 81 days.

(21) Appl. No.: 10/234,077

(22) Filed: Sep. 3, 2002

(65) Prior Publication Data

US 2003/0069664 A1 Apr. 10, 2003

(30) Foreign Application Priority Data

Aug. 31, 2001 (DE) .......................... 101 43 722

(51) Int. Cl.[7] .............. B07C 5/00; G06K 9/00
(52) U.S. Cl. ............. 209/583; 209/577; 209/587; 414/937
(58) Field of Search ................ 209/569, 567, 209/577, 583; 414/937

(56) References Cited

U.S. PATENT DOCUMENTS

| 5,225,691 | A |   | 7/1993  | Powers et al. |              |
|-----------|---|---|---------|---------------|--------------|
| 5,605,428 | A | * | 2/1997  | Birkner et al.| 414/331.15   |
| 5,686,834 | A | * | 11/1997 | Okudaira et al.| 324/158.1   |
| 6,213,708 | B1|   | 4/2001  | Allen         |              |
| 6,265,684 | B1| * | 7/2001  | Wu            | 209/583      |
| 6,616,394 | B1| * | 9/2003  | Park          | 414/222.01   |
| 2001/0043580 | A1 |  | 11/2001 | Schlehahn  |              |

FOREIGN PATENT DOCUMENTS

| DE | 195 35 871 C2 |   | 4/1997 |            |
|----|---------------|---|--------|------------|
| JP | 06144522 A    | * | 5/1994 | B65G/1/137 |
| JP | 11 157 609 A  |   | 6/1999 |            |

* cited by examiner

Primary Examiner—Donald P. Walsh
Assistant Examiner—Kaitlin Joerger
(74) Attorney, Agent, or Firm—Laurence A. Greenberg; Werner H. Stemer; Ralph E. Locher

(57) ABSTRACT

A method and a device for sorting wafers from an initial state into an end state. The wafers are at least partly identifiable as elements of a finite sequence based on an information carrier. In the initial state, the wafers are arranged in any desired sequence in compartments of a holding device and in the end state each wafer is arranged in accordance with its position in the sequence in the compartments of the holding device. The first wafer is removed from a first compartment of the holding device. The information carrier of the first wafer is read by a reading device to determine the position of the first wafer in the sequence. Subsequently, a second wafer is removed from a second compartment corresponding to the position of the first wafer in the sequence. The first wafer is moved into the compartment corresponding to its position in the sequence.

8 Claims, 4 Drawing Sheets

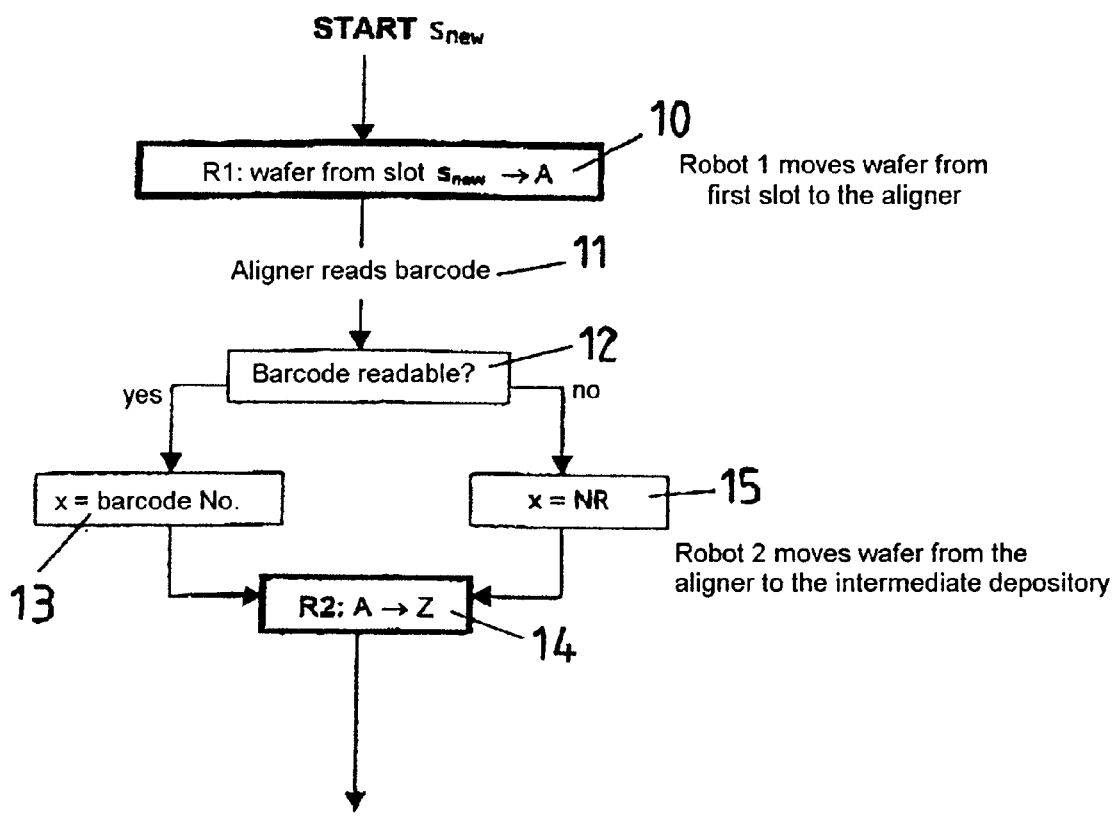

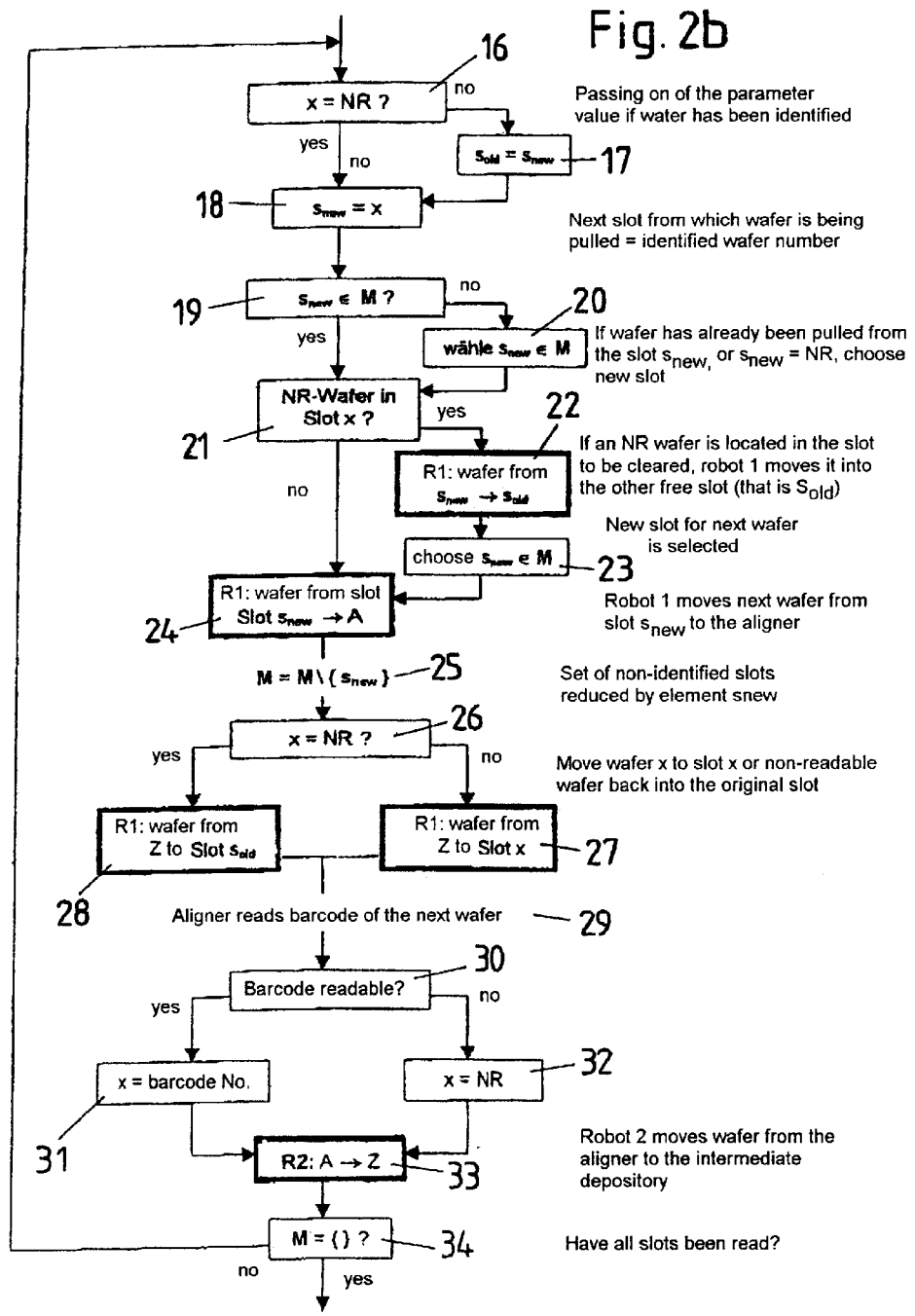

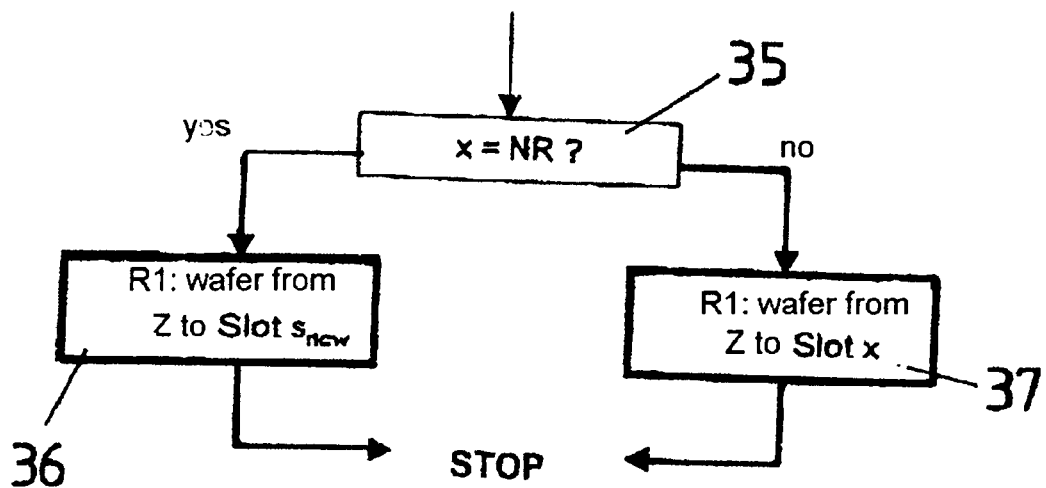

METHOD AND DEVICE FOR SORTING WAFERS

BACKGROUND OF THE INVENTION

FIELD OF THE INVENTION

The invention relates to a method for sorting wafers from an initial state, in which the wafers are arranged in any desired sequence in compartments of a holding device, to an end state in which the wafers are arranged in accordance with a prescribed sequence, as much as possible, in the compartments of the holding device. The wafers are identifiable as elements of a finite sequence based on an information carrier.

It is known, for example from U.S. Pat. No. 5,225,691, to transport wafers of a chip production operation in what are known as tray cassettes, in order to protect the sensitive wafers. The wafers are in this case stored in individual slots of the tray cassette in such a way that they can be easily removed by machine (for example by a robot). Each of the wafers has an information carrier (for example a barcode), which contains, for example, the association with a specific batch and a consecutive number as an identification feature.

The wafers are regularly removed during chip production for further processing of the tray cassettes. For this purpose it is frequently necessary to bring the wafers of the tray cassette into a specific sequence (for example into the correct sequence of the identification features).

Devices are known for this type of handling of the wafers, such as for example, the sorting system taught in U.S. Pat. No. 6,213,708.

It is also known to use what are known as two-cassette mappers, in order to sort wafers from one tray cassette into another tray cassette or within a tray. In this case, the sorting takes place in two steps. In the first step, all of the wafers are pulled one after the other by a robot, a barcode as an information carrier is read by a device (aligner), and after being intermediately deposited, a wafer is pushed back into the original slot of the tray cassette. In a second step, the wafers are rearranged into the correct slots based on the information of the identified wafer numbers read from the barcode.

If barcodes of some wafers cannot be identified, they are initially pushed back into the original slot and the sorting operation is continued for the remaining wafers. At the end, a machine-based inspection of the non-identified wafers is performed by a member of staff. The two steps involved in sorting make the overall sorting time considerably longer.

SUMMARY OF THE INVENTION

The present invention is based on providing a method and a device with which the number of reading operations on information carriers and the number of wafer movements are as small as possible.

The object of the invention is based on a method for sorting wafers of a chip production operation from an initial state into an end state. The method includes steps of:
providing the wafers in the initial state such that the wafers are arranged in a given sequence in compartments of a holding device;
enabling the wafers to be at least partly identified as elements of a finite sequence based on information carriers; and
sorting the wafers into the end state in which each wafer is arranged, as much as possible in accordance with a prescribed sequence, in the compartments of the holding device by:

removing a first wafer from a first compartment of the holding device,
with a reading device, reading an information carrier of the first wafer to determine a position of the first wafer in the prescribed sequence,
subsequently, removing a second wafer from a second compartment corresponding to the position of the first wafer in the prescribed sequence, and
moving the first wafer into a compartment corresponding to the position of the first wafer in the prescribed sequence.

The object of the invention is also based on a wafer sorting apparatus including: a data processing device for controlling the above-described method for sorting the wafers of the chip production operation from the initial state into the end state; at least one device for moving at least the first wafer and the second wafer; and a reading device for reading the information carrier of the first wafer.

According to the invention, a first wafer is removed from a first compartment of the holding device and the information carrier of the first wafer is read by a reading device to determine the position of the first wafer in a finite sequence. Consequently, it is ascertained, for example, which number the first wafer has in the sequence of all the wafers in a holding device.

Subsequently, a second wafer is removed from a second compartment, the second compartment corresponding to the position of the first wafer in the sequence. Consequently, space for the first wafer is created. The first wafer is then moved into the second compartment, which corresponds to its position in the sequence.

This direct sorting eliminates identifying all of the wafers, in order to subsequently to perform sorting. According to the invention, a two-step strategy is transformed into a direct sorting. This allows the sorting time to be shortened considerably.

It is advantageous in this case if the sequence in the end state corresponds to the sequence of an identification number of the wafer. Since wafers generally have such numbering, it is particularly easy to provide sorting in this sequence.

Under certain circumstances it may be advantageous if the sequence of the wafers in the end state deviates from the sequence of the identification numbers. Consequently, for example, a table with a desired sorting sequence may be prescribed as the sequence and the inventive method sorts the wafers according to this sequence.

A refinement of the method is particularly advantageous and includes, if a wafer has a non-readable information carrier, in particular a non-readable barcode, this wafer in the end state of the sorting is arranged in a compartment of the holding device which is not occupied by a wafer with a readable information carrier. It is ensured by the direct sorting that the non-readable wafers are identified and sorted into their appropriate positions.

It is particularly advantageous in this case if the compartment, in which a wafer with a non-readable information carrier is arranged, is automatically provided with a marking. Consequently, an operator can easily identify in which compartment a wafer with a non-readable information carrier lies.

Furthermore, it is advantageous if each wafer which has a non-readable information carrier is provided with a flag for non-readability by a program of a data processing device. A flag is understood here as meaning a programming identification that can assume only two states. For example, the flag is set if the information carrier is non-readable, and the flag is not set if the information carrier is readable.

The inventive device includes: at least one device for moving at least one wafer; a reading device for an information carrier of the wafer; and a data processing device for controlling the procedure of the method. The invention is explained in more detail below on the basis of several exemplary embodiments with reference to the figures of the drawings.

BRIEF DESCRIPTION OF THE DRAWINGS

FIGS. 2A–2C show a program flow chart of an embodiment of the inventive method.

DESCRIPTION OF THE PREFERRED EMBODIMENTS

Figure 1:
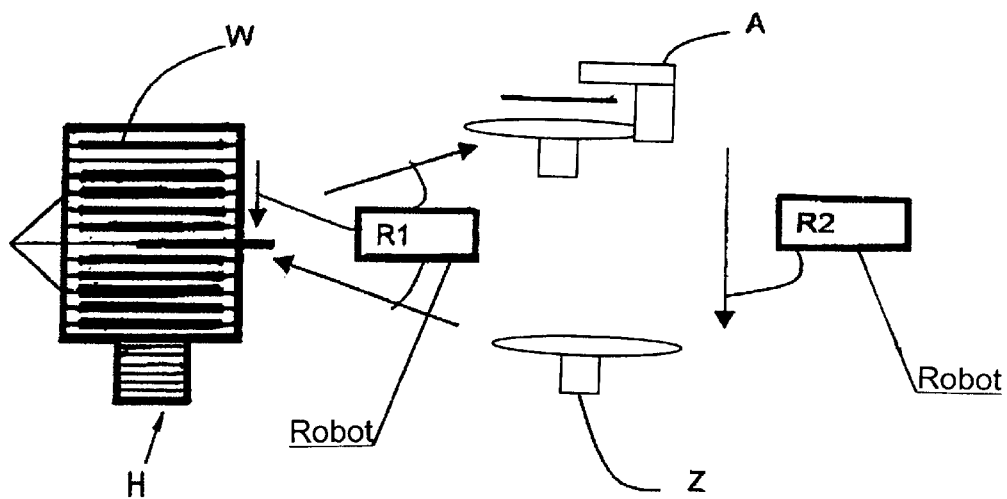
FIG. 1 is a schematic view of an inventive device for direct sorting.
Figure 1:
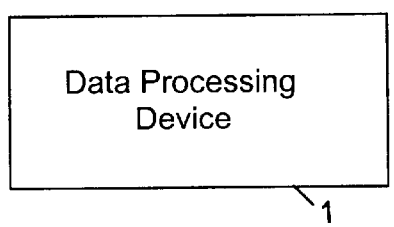

FIG. 1 shows the main parts of a device for performing the direct sorting of wafers. There are usually 25 wafers W in a tray cassette H serving as a holding device for the wafers W. The wafers W are arranged in individual, horizontal compartments s, known as slots s. The entire tray cassette H is vertically adjustable, so that a first robot R1 can in each case remove a wafer W at the same height from the tray cassette H. This is represented in FIG. 1 by a wafer W being partially removed from the tray cassette H. Alternatively, the first robot R1 may also have a correspondingly movable arm, which can be used in the case of a stationary holding device.

The first robot R1 can perform three actions, which are respectively symbolized in FIG. 1 by arrows.
1. A wafer W may be transported by the first robot R1 from a slot s of the tray cassette H to an aligner A. The aligner A has in a known way an identification device for wafers W. In the present case, the identification device is designed as a reader for a barcode on the wafer W.
2. A wafer W may be transported by the first robot R1 from an intermediate depository Z into a slot s of the tray cassette H. The intermediate depository Z is required as an intermediate storage location for wafers W during sorting.
3. A wafer W may be transported by the first robot R1 from a first slot into a second slot of the tray cassette H.

The operating mode of the first robot R1 is known in principle, so the handling is not described in any more detail here.

In this exemplary embodiment of the method, a second robot R2 serves exclusively for transporting a wafer from the aligner A to the intermediate depository Z.

The control of the tray cassette H, of the first robot R1, of the second robot R2, and of the aligner A takes place using a data processing device 1. The connections between the data processing device 1 and the controlled components are not represented here for simplicity.

The operating mode of an embodiment of the direct-sorting inventive method is explained below on the basis of the program flow chart shown in FIGS. 2A–2C. In this case, the program flow chart extends over FIGS. 2A–2C. FIG. 2B represents the continuation of FIG. 2A, FIG. 2C represents the continuation of FIG. 2B.

This method is stored in the form of software on the data processing device 1. Alternatively, the control of the method may also be implemented in the form of a hardware module.

The aim of the method here is to re-sort a number of wafers W in a tray cassette H, starting from an initial state, in such a way that the wafers W are arranged in consecutive numbering (i.e. a prescribed sequence) in the individual slots s. This is the end state.

In method step 10, the first robot R1 pulls a first wafer W1 out of a slot s of the tray cassette H and deposits this first wafer W1 in the aligner A.

In method step 11, the aligner A reads a barcode on the first wafer W1, which uniquely identifies the first wafer W1. The barcode has a batch number of the wafer W and a consecutive number (in the case of a 25-slot tray cassette: numbers from the interval [1, 25] which identify the wafer W). In the event that a wafer W is missing, there is a gap in the numbering.

In method step 12, it is checked whether the barcode is readable, which can be established, for example, on the basis of a check digit.

If the barcode is readable, the read consecutive number of the first wafer W1 is assigned in method step 13 as number x of the wafer. The number x consequently stands for the particular wafer W pulled at the given time.

Subsequently, in method step 14, the first wafer W1 is placed by the second robot R2 from the aligner A onto the intermediate depository Z.

If the barcode of the first wafer W1 is not readable, the corresponding wafer W is assigned a non-readable flag NR in method step 15. In the present case, this is the number 99. In principle, however, other strings or signals are also conceivable as a flag. The system identifies on the basis of this flag that the barcode of this wafer is not readable. Although the case of a non-readable barcode occurs relatively infrequently, it leads to considerable disruptions in the procedure of the process. For this reason, the sorting method would make allowance for this.

Subsequently, the first wafer W1 is placed by the second robot R2 from the aligner onto the intermediate depository Z (method step 14).

In method step 16, it is checked whether the number x of the first wafer W1 is equal to the flag NR, in order to establish whether the first wafer W1 lying at that time on the intermediate depository Z does or does not have a readable barcode.

Method step 16 is also the return address for the method, i.e. all subsequent method steps are executed until all of the wafers W in the tray cassette H have been sorted.

If the condition x=NR of method step 16 is not satisfied, i.e. the first wafer W1 has a readable barcode, and a parameter value of the slot s is passed on in method step 17: the parameter value $S_{old}$ is passed on to become the value $s_{new}$.

Then, in method step 18, the variable $s_{new}$ is subsequently assigned a new value, that is x, i.e. the number of the pulled wafer: $s_{new}$=x. Consequently, as the method proceeds, it is then established from which slot $s_{new}$ the next wafer (i.e. the second wafer W2) is being pulled.

If the condition x=NR of method step 16 is satisfied, i.e. the first wafer W1 has a non-readable barcode, method step 18 is executed straightaway, in that $s_{new}$ is given the value of the NR flag.

Method step 18 is consequently executed in the case of a readable barcode and in the case of a non-readable barcode. It must then be established from which slot s the next wafer, the second wafer W2, is being pulled.

In the then following method step 19, it is checked whether the newly established value for $s_{new}$ is contained in the set M of the set of all slots s which have not yet been identified.

If this is not the case (wafer from $s_{new}$ had already been pulled or $S_{new}$=NR), an $s_{new}$ which is an element of the set M is determined in method step 20. Advantageously, the element with the smallest ordinal number in the set M is chosen in each case. This has the advantage that, in the case of an already sorted cassette, the wafers are processed in the sequence from 1 to the maximum (for example 25) and the tray carrier must only be advanced by one slot position at a time. This case does occur, since it is not readily evident from a tray whether the wafers have already been sorted or not.

If $s_{new}$ is an element of the set M, it is checked in method step 21 whether a non-readable wafer lies in the slot s with the number x.

If this is not the case, in method step 24 the second wafer W2 is fetched from the slot $s_{new}$ and placed by the first robot R1 onto the aligner A. Consequently, the second wafer W2 is pulled on the basis of the reading result of the first wafer W1.

If a non-readable wafer W is lying in the slot x to be cleared, in method step 22 the first robot R1 will move the wafer W into the slot from which the previously pulled wafer W originates, that is slot $s_{old}$.

Subsequently, in method step 23, a new value for $s_{new}$ is determined, this value being an element of the set M.

Then method step 24 can be executed, i.e. a new wafer W can be fetched from the slot $s_{new}$ and be deposited on the aligner A.

In method step 25, the element $s_{new}$ is removed from the set M, since it is no longer part of the non-identified slots.

It must now be decided what is to happen with the previously pulled first wafer W1, which is lying on the intermediate depository Z.

For this purpose, it is first checked in method step 26 whether the wafer newly pulled from the slot $s_{new}$ with the number x is a non-readable NR wafer.

If not, in method step 27 the first wafer W1 is moved from the intermediate depository Z into the slot x. This achieves the effect that the first wafer W1 comes to lie in the slot s which corresponds to the sequence of its identification number (for example 1, 2, 3 . . .).

Alternatively, it is also possible, however, to prescribe a different sequence, for example in the form of a table. Then it is ascertained in method step 27 which table value y is assigned to the x of the first wafer (W1). The first wafer (W1) is then placed into this slot s. Such a procedure may be required for example in the case of split attempts.

If the wafer is non-readable, in method step 28 the wafer is moved into the slot with the number $s_{old}$.

Subsequently, in method step 29, the aligner A reads the barcode of the second wafer W2 located in it.

In method step 30, it is checked whether the barcode of the second wafer W2 is readable.

If the barcode is readable, in method step 31 the value x is set equal to the value of the barcode (analogous to method step 13).

If the barcode is not readable, in method step 32 the non-readable flag NR is set: x=NR.

In method step 33, the second robot moves the second wafer W2 from the aligner A to the intermediate depository.

In method step 34, it is checked whether the set M of the non-identified wafer slots is empty, i.e. whether all the wafers have already been checked.

If this is the case, then, in method step 35, a check whether x=NR takes place.

If this applies, in method step 36 the wafer W is placed by the first robot R1 from the intermediate depository into the slot $s_{new}$ and the method is ended.

If the condition x=NR does not apply, in method step 37 the second wafer W2, located on the intermediate depository Z, is moved by the first robot R1 into the slot x and the method is ended.

If the set M is not yet empty, the method is continued at method step 16.

With the ending of the method, the end state is reached. The wafers W which have an identifiable information carrier lie in the slots s according to the prescribed sequence, for example the numbers of the wafers. The non-readable wafers W lie in the respective remaining slots s.

The terms first and second wafer were only introduced in the above description to explain the essential idea of the method. The principle involved here is that the second wafer W2 is always pulled on the basis of the result of the check on the first wafer W1. In principle, many wafers can be sorted by the method according to the invention, this method being used of course for all the wafers W.

The method is demonstrated below on the basis of a greatly simplified example, the wafer designations not coinciding with the above description.

It is assumed that the tray cassette H has three slots (s1, s2, s3), in which three wafers (W1, W2, W3) are stored. The second wafer W2 has in this case a non-readable barcode. It is assumed that the initial situation is:

| Slot | Wafer |
|------|-------|
| 1 | W3 |
| 2 | W2 (NR) |
| 3 | W1 |

It is intended for this arrangement to be sorted by the inventive method. To simplify matters, in this case reference is made only to method steps. The actions of a robot, i.e. the movement of a wafer W1, W2, W3, are emphasized by bold type.

10: W3 is moved from s1 to A (starting value $s_{new}$=1)
13: The number of the wafer W3 is formed from the barcode of the wafer W3: x=3
14: W3 is moved from A to z
16: W3 is readable, so that
17: $s_{old}=s_{new} \rightarrow s_{old}=1$
18: $s_{new}=x \rightarrow s_{new}=3$
19: $s_{new}$ is an element of M={2,3}
21: There is no NR wafer in slot s3
24: W1 is moved from s3 to A (W3 is still lying on Z)
25: M={2}
26: x is not equal to the NR flag
27: W3 is moved from Z to s3 (the first wafer W3 is arranged in the correct slot)
29: A reads the barcode of W1 (readable) which is lying on A
31: x=1 is determined from the barcode
33: W1 is moved from A to Z
34: M is not empty
16: x is not equal to the NR flag
17: $s_{old}=s_{new} \rightarrow s_{old}=3$
18: $s_{new}=x \rightarrow s_{new}=1$
19: $s_{new}$ is not an element of M
20: $s_{new}=2$ is chosen
21: No NR wafer in slot s1
24: W2 is moved from s2 to A
25: Set M becomes empty
26: x is not equal to NR
27: W1 is moved from Z to slot x, i.e. to s1 (W1 lies in the correct compartment)
29: A reads the barcode of W2, the barcode is non-readable
32: x=99 (NR flag)
33: W2 is moved from A to Z 34: M is empty
35: x is NR
36: W2 is moved from Z to s2 (W2 also lies in the correct, last-remaining slot s)

Consequently, the wafers W1, W2, W3 are lying in the respective slots. The wafer W2 is identified as non-readable.

The invention is not restricted in its implementation to the preferred exemplary embodiments specified above. Rather, a number of variants which make use of the method according to the invention and the device according to the invention in implementations of a fundamentally different nature are also conceivable.

List of Designations x: number of the wafer from slot ($s_{new} \in \{1, \ldots, slot_{max}\}$)

$s_{new}$: slot from which the next wafer is to be pulled or from which a wafer has just been pulled (starting value, for example $s_{new}=1$)

$s_{old}$: (value passed on from $s_{new}$) slot from which the previous wafer was pulled M: set of all wafer slots with not yet identified wafers $M=\{2,3, \ldots, slot_{max}\}$ NR: flag for wafers (for example NR=99) for which the barcodes could not be read (non-readable wafers)

A: aligner (reads barcode), reading device
H: tray cassette, holding device
s: slot
W: wafer
Z: intermediate depository
R1: action of the first robot
Slot x→A Moves wafer from cassette slot x to aligner
Z→slot x Moves wafer from intermediate depository to cassette slot x
Slot x→Moves wafer from cassette slot x to slot y cassette slot y
R2: action of the second robot
A→Z Moves wafer from aligner to intermediate depository

We claim:

1. A method for sorting wafers of a chip production operation from an initial state into an end state, the method which comprises:
    providing the wafers in the initial state such that the wafers are arranged in a given sequence in compartments of a holding device;
    enabling the wafers to be at least partly identified as elements of a finite sequence based on information carriers; and
    sorting the wafers into the end state in which each wafer is arranged, as much as possible in accordance with a prescribed sequence, in the compartments of the holding device by:
        removing a first wafer from a first compartment of the holding device,
        with a reading device, reading an information carrier of the first wafer to determine a position of the first wafer in the prescribed sequence,
        subsequently, removing a second wafer from a second compartment corresponding to the position of the first wafer in the prescribed sequence, and
        moving the first wafer into a compartment corresponding to the position of the first wafer in the prescribed sequence.

2. The method according to claim 1, wherein the prescribed sequence of the wafers in the end state corresponds to a sequence of identification numbers of the wafers.

3. The method according to claim 1, wherein the prescribed sequence of the wafers in the end state is not identical to a sequence of identification numbers of the wafers.

4. The method according to claim 1, wherein in the end state, a wafer having a non-readable information carrier is arranged in a compartment of the holding device that is not occupied by a wafer with a readable information carrier.

5. The method according to claim 4, wherein the non-readable information carrier is a non-readable barcode.

6. The method according to claim 1, which comprises automatically providing a marking to a compartment in which a wafer with a non-readable information carrier is arranged.

7. The method according to claim 1, which comprises using a program on a data processing device to provide each wafer having a non-readable information carrier with a flag indicating non-readability.

8. A wafer sorting apparatus, comprising:
    a data processing device for controlling a method for sorting wafers of a chip production operation from an initial state into an end state, the method including steps of:
        providing the wafers in the initial state such that the wafers are arranged in a given sequence in compartments of a holding device;
        enabling the wafers to be at least partly identified as elements of a finite sequence based on information carriers; and
        sorting the wafers into the end state in which each wafer is arranged, as much as possible in accordance with a prescribed sequence, in the compartments of the holding device by:
            removing a first wafer from a first compartment of the holding device,
            reading an information carrier of the first wafer to determine a position of the first wafer in the prescribed sequence,
            subsequently, removing a second wafer from a second compartment corresponding to the position of the first wafer in the prescribed sequence, and
            moving the first wafer into a compartment corresponding to the position of the first wafer in the prescribed sequence;
    at least one device for moving at least the first wafer and the second wafer; and
    a reading device for reading the information carrier of the first wafer.

* * * * *